(12) United States Patent
Hultin Stigenberg et al.

(10) Patent No.: US 7,147,931 B2
(45) Date of Patent: *Dec. 12, 2006

(54) METAL STRIP PRODUCT

(75) Inventors: Anna Hultin Stigenberg, Sandivken (SE); Mikael Schuisky, Sandviken (SE)

(73) Assignee: Sandvik Intellectual Property AB, Sandviken (SE)

( * ) Notice: Subject to any disclaimer, the term of this patent is extended or adjusted under 35 U.S.C. 154(b) by 0 days.

This patent is subject to a terminal disclaimer.

(21) Appl. No.: 10/915,508

(22) Filed: Aug. 11, 2004

(65) Prior Publication Data

US 2005/0064214 A1    Mar. 24, 2005

(30) Foreign Application Priority Data

Aug. 12, 2003    (SE)    .................................... 0302207

(51) Int. Cl.
 *B32B 15/01* (2006.01)
 *B32B 15/18* (2006.01)
 *B21K 11/00* (2006.01)
 *C21D 1/18* (2006.01)
 *C25D 11/38* (2006.01)

(52) U.S. Cl. ...................... 428/615; 428/622; 428/623; 428/666; 428/667; 427/528; 427/529; 427/530; 427/585

(58) Field of Classification Search ................ 428/615, 428/622, 627, 633, 667; 427/529, 530, 528, 427/585

See application file for complete search history.

(56) References Cited

U.S. PATENT DOCUMENTS

| | | | |
|---|---|---|---|
| 3,562,140 A | 2/1971 | Skinner et al. | |
| 3,632,494 A | 1/1972 | Herte et al. | |
| 3,976,555 A | 8/1976 | Von Hartel | |
| 4,940,638 A * | 7/1990 | Adaniya et al. | 428/648 |
| 5,021,102 A * | 6/1991 | Harreither | 148/518 |
| 5,741,404 A | 4/1998 | Cathey | |
| 5,842,387 A * | 12/1998 | Marcus et al. | 76/104.1 |
| 6,063,436 A | 5/2000 | Pavell et al. | |
| 6,096,180 A | 8/2000 | Sichmann | |
| 6,238,778 B1 * | 5/2001 | Schneider | 428/209 |
| 6,284,356 B1 * | 9/2001 | Kiriyama | 428/698 |
| 2004/0118347 A1 * | 6/2004 | Groves et al. | 118/723 EB |
| 2004/0197581 A1 | 10/2004 | Berglund | |

FOREIGN PATENT DOCUMENTS

| | | |
|---|---|---|
| DE | 199 32 444 | 2/2001 |
| EP | 0 243 556 | 11/1987 |

(Continued)

OTHER PUBLICATIONS

Hultin Stigenberg et al., U.S. Appl. No. 10/915,513 filed Aug. 11, 2004, entitled "Metal Strip Product".

*Primary Examiner*—Jennifer C. McNeil
*Assistant Examiner*—Aaron Austin
(74) *Attorney, Agent, or Firm*—Drinker Biddle & Reath LLP

(57) ABSTRACT

A coated steel strip product with a dense and hard abrasion resistant coating on one side or both sides of said strip substrate is provided. The thickness of said coating is in total maximally 25 μm, the hardness of said coating is at least 600 HV and the tensile strength of the steel strip substrate is at least 1200 MPa. The coating is preferably applied by electron beam evaporation and the coating may be, e.g., of $Al_2O_3$. The coated metal strip is suitable for shaving equipment, medical instruments, utility and industrial knives as well as saw applications.

17 Claims, 2 Drawing Sheets

FOREIGN PATENT DOCUMENTS

| | | |
|---|---|---|
| JP | 63-20447 | 1/1988 |
| WO | 99/54520 A1 | 10/1999 |
| WO | WO 99/64674 | 12/1999 |
| WO | WO 02/091461 | 11/2002 |

* cited by examiner

METAL STRIP PRODUCT

RELATED APPLICATION DATA

This application is based on and claims priority under 37 U.S.C. §119 to Swedish Application No. 0302207-6, filed Aug. 12, 2003, the entire contents of which are incorporated herein by reference.

FIELD OF THE DISCLOSURE

The present disclosure relates to a coated steel strip material with a very hard and dense coating. It also relates to a method of manufacturing such a coated steel strip in a continuous roll-to-roll process which results in a very good adhesion of a hard and dense coating on a metal strip substrate. In particular, it relates to coated steel strips, which have such a good adhesion of the hard coating that they are suitable for use in shaving equipment, medical instruments, utility and industrial knives as well as saw applications.

STATE OF THE ART

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Coated steel products can be used in various applications. One example is in the manufacture of knives, such as utility knives, e.g., slicers, carving knives, bread knives, butcher's knives, mixer blades, hunting and fishing knives, pocket knives, and industrial knives for cutting synthetic fibre, paper, plastic film, fabrics and carpets. Furthermore, these products can be used in saw applications and as medical instruments and surgical knives. Another example is in shaving applications, such as razor blades and cutters. Just to name a few.

These are all applications where a hard and dense wear coating may be suitable, or even needed. Wear can, for example, result in the coating being torn off or cracking. These are also applications which need to have hard and sharp edges and cutting surfaces. Furthermore, many of the applications listed above are used in corrosive environments and therefore use a corrosion resistant surface.

For cost reasons, a continuous roll-to-roll coating process, preferably integrated in the production of the steel strip is preferred. Further, for quality reasons, a dense coating with very good adhesion to the substrate is of advantage. From a cost perspective, it is also a further advantage if there is such a good adhesion of the abrasion resistant coating that there is no need of any separate bond-coat.

The good adhesion of a dense coating is needed for the functional quality of the finished product. A poor adhesion, or a porous or coarse coating, would cause problems during usage of, for example, an industrial knife or saw, e.g., that the coating starts to flake off, that grains or small pieces are torn off, or that fissure problems occur. All in all, this is not acceptable from a quality and cost perspective.

There are several common methods of making a coating and also several different types of coatings that are being used. As examples can be mentioned:

Ceramic coatings, often consisting of $Al_2O_3$ with possible additions of $TiO_2$ and/or $ZrO_2$. This type of coating is normally applied by using a thermal spray method. Thermal spray methods have normally some major drawbacks. For example, the formed coating is rough which means that polishing or other further processing must usually be done to the surface after the coating. Also, a thermal spray coating usually includes a high degree of porosity, implying that a thin dense coating normally can not be achieved. Furthermore, the thickness of thermal sprayed coatings is normally rather high. During usage, a thick and coarse coating has an increased risk of fissure formation or that grains tear off from the surface. In many cases expensive nickel or nickel alloys must also be used as a bond-coat in order to improve the adhesion of the ceramic coating.

Metallic coatings, often consisting of pure nickel or chromium, or in the form of a compound such as nickel-phosphorus. These types of metallic coatings are normally applied by using a plating method, and especially electrolytic plating. Electrolytic plating methods have some drawbacks, one major drawback being the difficulty to obtain an even thickness and also that the adhesion of the coating can be poor. Also, plating processes are not environmentally friendly; on the contrary, these processes are often causing environmental problems.

Combinations of coatings, such as a nickel coating comprising abrasion resistant particles, e.g., SiC. This method also has some drawbacks, in principle the same drawbacks as for electrolytic plating as described above, but also that nickel is used to a large extent as a bond-coat, meaning that the coating is very expensive.

SUMMARY

Therefore, it is a primary object of the present invention to provide a hard and abrasion resistant coated metal strip with improved adhesion between a dense coating and the substrate. A further object of the present invention is to obtain a cost-efficient coating in a continuous roll-to-roll process integrated in the production of a steel strip. A further object of the present invention is to obtain a coating with a thickness as uniform as possible. These and other objects have been surprisingly attained by providing a coated steel product as described herein.

An exemplary coated steel product comprises a steel strip substrate and a dense and hard abrasion resistant coating on one side or both sides of said strip substrate. The coating is directly applied on the strip substrate, a thickness of the coating is in total maximally 25 µm, a ratio between the thickness of the coating and a thickness of the strip substrate is 0.001 to 7%, a hardness of the coating is at least 600 HV and a tensile strength of the steel strip substrate is at least 1200 MPa.

An exemplary method of manufacturing a coated steel product, the coated steel strip product having a steel strip substrate and a dense and hard abrasion resistant coating on one side or both sides of said strip substrate, wherein the coating is directly applied on the strip substrate, a thickness of the coating is in total maximally 25 µm, a ratio between the thickness of the coating and a thickness of the strip substrate is 0.001 to 7%, a hardness of the coating is at least 600 HV and a tensile strength of the steel strip substrate is at least 1200 MPa, the method comprises operating a strip production line in a continuous roll-to-roll process at a feed rate of at least 2.5 m/min to feed the strip substrate, removing a thin oxide layer from the strip substrate by ion assisted etching in an etch chamber to form a cleaned strip substrate, and depositing the coating directly on the cleaned strip substrate by electron beam evaporation in an electron beam deposition chamber, wherein both the etch chamber and the electron beam deposition chamber are integrated into the continuous roll-to-roll process.

BRIEF DESCRIPTION OF THE DRAWING FIGURES

The following detailed description of preferred embodiments can be read in connection with the accompanying drawings in which like numerals designate like elements and in which.

DETAILED DESCRIPTION OF PREFERRED EMBODIMENTS

Figures 1, 2:
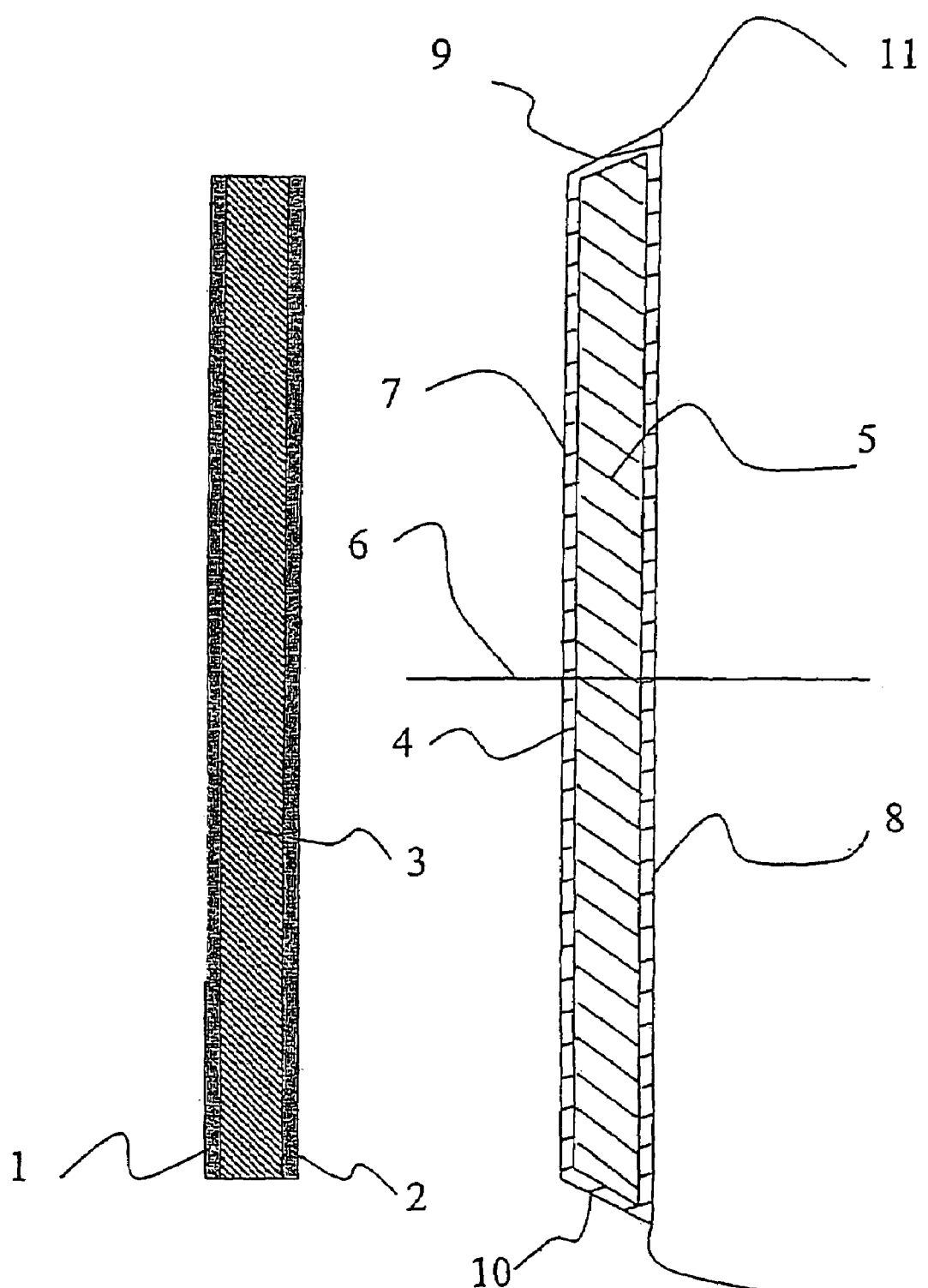
FIG. 1 shows a schematic cross-section of a metal strip according to one embodiment of the invention.
FIG. 2 shows a schematic cross-section of a metal strip according to a second embodiment of the invention.

A suitable coating for the use in shaving equipment, medical instruments, utility and industrial knives as well as saw applications is a dense and abrasion resistant coating with good adhesion. These are all applications in which wear often arise on the blades. For example in the case of shaving equipment, a razor blade should be able to withstand the wear during shaving, thereby keeping a sharp shaving edge, and at the same time withstand the corrosive environment. A suitable coating for use in the above mentioned applications has a dense layer of an abrasion resistant coating with good adhesion, which is hard but also tough enough to withstand the work-load and pressure during usage, with a reduced or no tendency to brittleness or tearing off.

To reduce or eliminate wear on the end product, it is suitable to have the product coated with at least one layer of abrasion resistant coating. Both one-sided and two-sided coatings can be used. One-sided coatings are preferable from a cost perspective. For blade applications used in more severe conditions, or during longer running times, two-sided coatings may be preferable. Otherwise, problems may occur with, e.g., plastic deformation along the edge on the uncoated side, or that there is a material build-up along the edge of the uncoated side, which occasionally may be ripped off from a spot, causing material to locally be torn away from the edge of the blade.

The method described herein is suitable for thin coatings of hard and dense abrasion resistant coatings in thicknesses on each side up to 25 μm in total, normally up to 20 μm in total, preferably up to 15 μm in total. A maximum 12 μm or preferably maximum 10 μm in total is preferable from a cost perspective. If thicker coatings are to be coated, an optimum in cost versus properties may be achieved by using multi-layers with up to 10 layers, and where each layer is between 0.1 to 15 μm thick, suitably between 0.1 to 10 μm, or more suitably 0.1 to 7 μm, preferably 0.1 to 5 μm and even more preferably 0.1 to 3 μm.

The coating should be sufficiently wear-resistant in order to withstand the wear and shear exerted by the treated material, on the other hand it should not be too thick, due to economical reasons and fragility/brittleness.

The coating is performed at a rate of minimum 2.5 meters per minute, preferably min 5 m/min, most preferably min 10 m/min.

The abrasion resistance can be achieved by depositing at least one layer of dense oxide coating in the form of $Al_2O_3$, $TiO_2$ or $ZrO_2$, or mixtures of these oxides, preferably a layer of an $Al_2O_3$-based material. Depending on the requirements, an optimum of required hardness and toughness can be achieved by using mixed oxides in the coating. This can be achieved by co-evaporation of aluminum oxide and another selected oxide. Preferably it can be achieved by co-evaporation of aluminum oxide and any other oxide, preferably $TiO_2$ and/or $ZrO_2$. Multi-layers may also be used in order to enable a combination of oxides so as to optimize hardness and toughness by having up to 10 layers with different oxides in the layers.

As an alternative to the above-described abrasion resistant layer consisting of essentially oxides, also other dense and hard coatings such as metallic coatings can be used in the disclosed embodiments. Hard metallic coatings such as essentially pure Cr may be used if a simple and cheap coating is to be preferred in order to reduce cost as much as possible.

Yet another embodiment uses coatings of transition metal carbides and/or nitrides, such as e.g. TiN, TiC or CrN, also in some cases in combination with an oxide in the form of $Al_2O_3$, $TiO_2$ or $ZrO_2$, or mixtures of these oxides, preferably an $Al_2O_3$-based material. By using the multi-layer system with up to 10 layers, a coating existing of a combination of several layers of different oxides and nitrides can even further enhance the optimum of desired hardness and toughness.

In order to withstand the wear and shear forces, the hardness of the thin coating should be above 600 HV, more suitably above 700 HV, preferably above 800 HV and most preferably above 900 HV. Naturally, the hardness of the coating is suitably adjusted/matched to the requirements of the intended use of the final product.

The tolerances of each layer are maximum +/−10% of the layer thickness at strip widths up to 400 mm. This means that very tight tolerances can be achieved, which is of benefit for the precision during usage and the quality of the product. In comparison to plating or thermal spray this represents much higher tolerances. For instance, in plating there is a so called dog-bone effect, which results in varying thicknesses of the layer. In that case, the layer usually varies more than +/−50% of the layer thickness.

There is no need of any separate bond-coat, but nickel may still be used in one of the layers if it is required from a technical perspective, e.g., to enhance toughness. Since nickel is expensive, it is usually used in very thin layers only, suitably between 0 to 2 μm, preferably between 0 to 1 μm and most preferably between 0 to 0.5 μm. However, any possible nickel layer, if used, would not be the layer adjacent to the substrate.

Description of the substrate material to be coated: The material to be coated should have a good basic mechanical strength, suitable for the intended application. Preferably, it should be a hardenable steel in a hardened and tempered condition, or alternatively a precipitation hardenable steel, which in the end condition can achieve a tensile strength level above 1200 MPa, or preferably more than 1300 MPa, or at the best above 1400 MPa, or even 1500 MPa.

If the final coated product is intended for use in a corrosive environment, then the steel alloy should also have a sufficient addition of chromium to enable a good basic corrosion resistance. The Cr content in this case is above 10% by weight, or at least 11%, or preferably a minimum of 12%.

The coating method may be applied on any kind of product made of said type of steel alloy and in the form of a strip that has good hot workability and also can be cold-rolled to thin dimensions. The alloy also typically can be capable of readily being manufactured to shaving equipment like razor blades and/or cutters, medical instruments, utility and industrial knives as well as various saws, in a manufacturing process including steps such as forming, grinding, shaving, cutting, polishing, stamping, or the like. The thickness of the strip substrate material is usually between 0.015 mm to 5.0 mm and suitably between 0.03 mm to 3 mm. Preferably, it is between 0.03 to 2 mm, and even more preferably between 0.03 to 1.5 mm. Naturally, the thickness of the substrate is adapted to the intended use of the final product. The width of the substrate material depends on if the coating is made before or after the slitting operation. Appropriate widths are 1 to 1500 mm, suitably 1 to 1000 mm, or preferably 1 to 500 mm, or even more preferably between 5 and 500 mm. The length of the substrate material is suitably between 10 and 20,000 m, preferably between 100 and 20,000 m.

Description of the Coating Method: A variety of physical or chemical vapor deposition methods for the application of the coating media and the coating process may be used as long as they provide a continuous uniform and adherent coating. As exemplary of deposition methods can be mentioned chemical vapor deposition (CVD), metal organic chemical vapor deposition (MOCVD), physical vapor deposition (PVD) such as sputtering and evaporation by resistive heating, by electron beam, by induction, by arc resistance or by laser deposition methods. Electron beam evaporation (EB) is one method preferred for the deposition. Optionally, the EB evaporation can be plasma activated to even further ensure good quality coatings of hard and dense coatings.

The coating method is integrated in a roll-to-roll strip production line and the hard coating is deposited by means of electron beam evaporation (EB) in a roll-to-roll process. If multi-layers are needed, the formation of multi-layers can be achieved by integrating several EB deposition chambers in-line. The deposition of metallic coatings is made under reduced atmosphere at a maximum pressure of $1\times10^{-2}$ mbar with no addition of any reactive gas to promote essentially pure metal films. The deposition of metal oxides is performed under reduced pressure with an addition of an oxygen source as reactive gas in the chamber. A partial pressure of oxygen is in the range 1 to $100\times10^{-4}$ mbar. If other types of coatings are to be achieved, e.g., transition metal carbides and/or nitrides such as TiN, TiC or CrN, or mixtures thereof with, e.g., metal oxides, the conditions during the coating can be adjusted with regard to the partial pressure of a reactive gas so as to enable the formation of the intended compound. In the case of oxygen, a reactive gas such as $H_2O$, $O_2$ or $O_3$, but preferably $O_2$, may be used. In the case of nitrogen, a reactive gas such as $N_2$, $NH_3$ or $N_2H_4$, but preferably $N_2$, may be used. In the case of carbon, any carbon containing gas may be used as reactive gas, for an example $CH_4$, $C_2H_2$ or $C_2H_4$. All these reactive EB evaporation processes may be plasma activated.

To enable good adhesion, different types of cleaning steps are used. First, the surface of the substrate material is be cleaned to remove oil residues, which otherwise may negatively affect the efficiency of the coating process and the adhesion and quality of the coating. Moreover, the very thin native oxide layer that normally is present on a steel surface is removed. This can preferably be done by including a pre-treatment of the surface before the deposition of the coating. In the roll-to-roll production line, the first production step is therefore preferably an ion assisted etching of the metallic strip surface to achieve good adhesion of the first coating [see FIG. 3].

Two exemplary embodiments are now described in more detail. The first exemplary embodiment (FIG. 1) comprises a coating 1,2 for a substrate material 3 in full strip width. The substrate material can be made of different alloys, such as a hardenable carbon steel or a hardenable stainless chromium steel. The other exemplary embodiment (FIG. 2) comprises a coating 4 of a steel strip 5, which before the coating process, has been both slitted and edge treated. During coating, both the main sides 7,8 and the narrow lateral sides 9,10 are coated, thereby obtaining a full covering coating around the scraping or cutting edges 11,12. Suitably, the lateral sides 9 and 10 are coated simultaneously with the somewhat narrower main side 7. The examples given are only intended as illustrative and should not serve as a limitation to the present innovation.

The substrate material has a composition suitable for hardening, which means, for example:

Hardenable carbon steel of 0.1–1.5% C, 0.001–4% Cr, 0.01–1.5% Mn, 0.01–1.5% Si, up to 1% Ni, 0.001–0.5% N, rest essentially Fe; or Hardenable chromium steels of 0.1–1.5% C, 10–16% Cr, 0.001–1% Ni, 0.01–1.5% Mn, 0.01–1.5% Si, up to 3% Mo, 0.001–0.5% N, rest essentially Fe; or Precipitation hardenable steels of: 0.001–0.3% C, 10–16% Cr, 4–12% Ni, 0.1–1.5% Ti, 0.01–1.0% Al, 0.01–6% Mo, 0.001–4% Cu, 0.001–0.3% N, 0.01–1.5% Mn, 0.01–1.5% Si, rest essentially Fe.

EXAMPLE 1

The chemical compositions of the substrate materials in the example are according to the internal Sandvik designation 20C2 and 13C26, with essentially the following nominal composition:

Sandvik 20C2: 1.0% C, 1.4% Cr, 0.3% Si and 0.3% Mn (by weight); and

Sandvik 13C26: 0.7% C, 13% Cr, 0.4% Si and 0.7% Mn (by weight).

Firstly, the substrate materials are produced by ordinary metallurgical steelmaking to a chemical composition as described above. After this, they are hot-rolled down to an intermediate size, and thereafter cold-rolled in several steps with a number of recrystallization steps between said rolling steps, until a final thickness of 0.2 mm and a width of maximally 400 mm. Thereafter, the strip steels are hardened and tempered to the desired mechanical strength level, which is preferably at least 1200 MPa. The surface of the substrate material is then cleaned to remove oil residuals from the rolling and hardening operations.

Thereafter, the coating process takes place in a continuous process line, starting with decoiling equipment. The first step in the roll-to-roll process line can be a vacuum chamber or an entrance vacuum lock followed by an etch chamber, in which ion assisted etching takes place in order to remove the thin oxide layer on the substrate material. The strip then enters into the EB evaporation chamber(s) in which deposition of an oxide takes place. In this example, $Al_2O_3$ is selected as the material to be deposited. An oxide layer of normally 0.1 up to 25 μm is deposited; the preferred thickness depends on the application. In the examples described here, a thickness of 2 μm is deposited by using one EB evaporation chamber. After the EB evaporation, the coated strip material passes through the exit vacuum chamber or exit vacuum lock before it is being coiled on to a coiler.

The coated strip material can now, if needed, be further processed by, for an example, slitting and edge treatment, to obtain the preferred final dimension and edge condition of the intended final application. It is an advantage if an additional coating along the edge of, for example, a knife blade application, can be made in a continuous coating process using EB evaporation, but also other processes may be used. Preferably, an additional coating along the edge of a finished blade is of same type as the coating applied on the strip material.

The end product as described here, i.e., a coated 20C2 and 13C26-strip material, respectively, in a strip thickness of 0.2 mm and with a thin coating of $Al_2O_3$ of 2 μm, has a very good adhesion of the coated layer and is thus suitable to use especially for the manufacturing of industrial knives.

Figure 3:
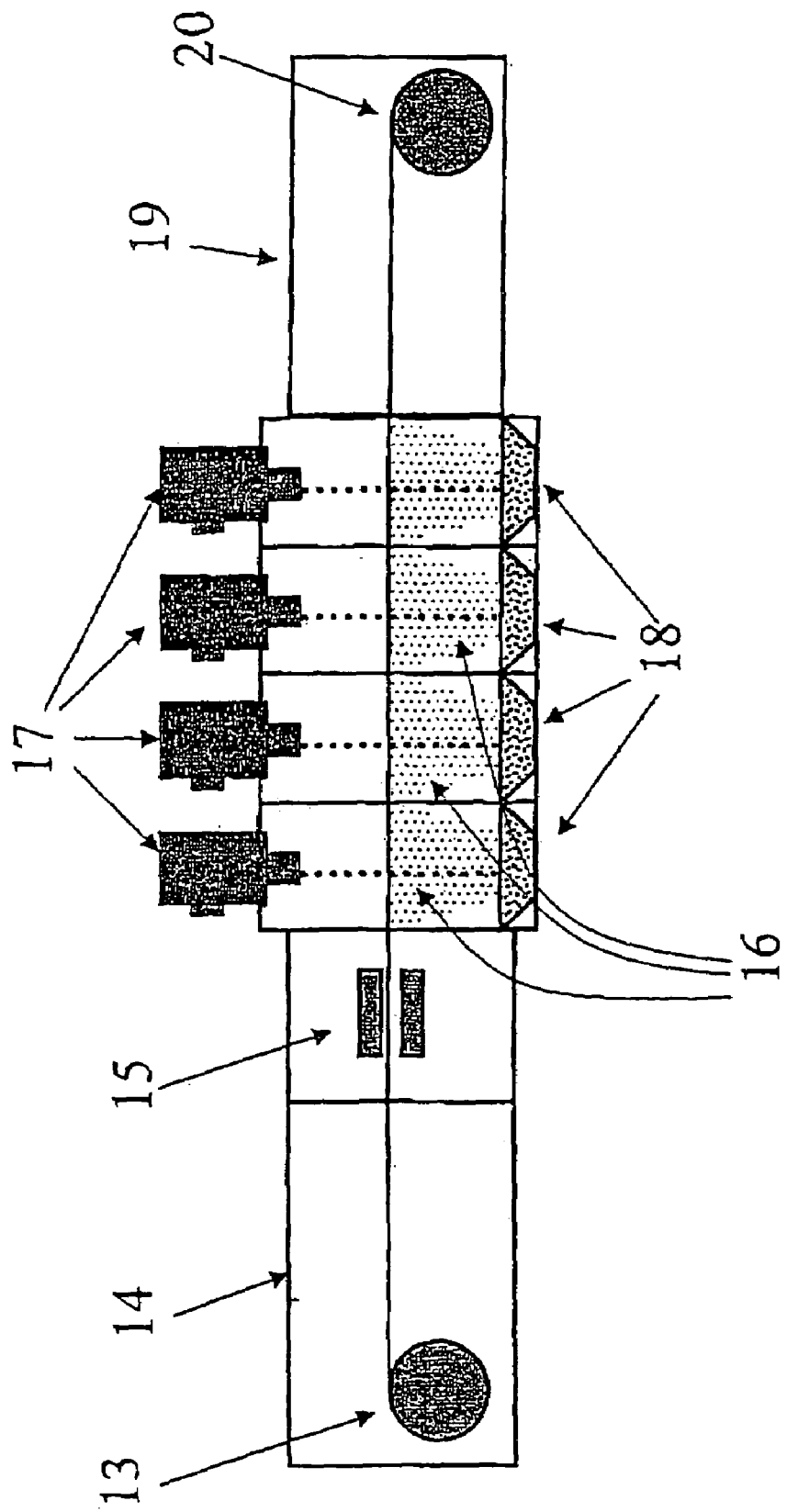
FIG. 3 shows schematically a production line for the manufacturing of a coated metal strip material according to an embodiment of the invention.

The roll-to-roll electron beam evaporation process referred to above is illustrated in FIG. 3. The first part of such a production line is the uncoiler 13 within a vacuum chamber 14, then the in-line ion assisted etching chamber 15, followed by a series of EB evaporation chambers 16. The number of EB evaporation chambers can vary from 1 up to 10 chambers to achieve a multi-layered structure, if so desired. All the EB evaporation chambers 16 are equipped with EB guns 17 and water-cooled copper crucibles 18 for the evaporation. After these chambers come the exit vacuum chamber 19 and the recoiler 20 for the coated strip material, the recoiler being located within vacuum chamber 19. The vacuum chambers 14 and 19 may also be replaced by an entrance vacuum lock system and an exit vacuum lock system, respectively. In the latter case, the uncoiler 13 and the coiler 20 are placed in the open air.

EXAMPLE 2

The chemical composition of the substrate material in this example is according to the internal Sandvik designation 20C with essentially the following nominal composition: Sandvik 20C: 1.0% C, 0.2% Cr, 0.3% Si and 0.4% Mn (by weight).

Firstly, the substrate material is produced by ordinary metallurgical steelmaking to a chemical composition as described above. The material is then hot-rolled down to an intermediate size, and thereafter cold-rolled in several steps with a number of recrystallization steps between said rolling steps, until a final thickness of 0.45 mm and a width of maximum 400 mm are attained. Thereafter, the steel strip is hardened and tempered to the desired mechanical strength level, which is preferably above 1200 MPa. The strip is afterwards slitted to a width corresponding to substantially twice the width of the final blade application. The edges along the slitted strip are then edge-treated, for example shaved, ground and polished, to the conditions and geometry considered suitable for the intended blade application. After this, the strip is submitted to a coating treatment fully analogous to Example 1, cf. also FIG. 3.

The end product will be a coated strip according to FIG. 2, the coating material and thickness being the same as in Example 1. Now, the coated strip material can be slitted in the middle along section 6 to obtain two coated strips, each with the dimension and edge geometry suitable for a finished blade. In principle, only cutting into required final length remains.

The end product as described in this example, i.e. a slitted, edge treated and coated strip material, in a strip thickness of 0.45 mm and a final slitted width of 100 mm, has a thin covering aluminum oxide layer of 2 μm with a very good adhesion of the coated layer. This product can be cut into required length, depending on the final application, without any further processing. It may also, if required, be further processed, e.g., with an additional edge treatment or with additional coatings along the edge, or polishing or the like, in order to meet a specific customer demand. An additional coating along the edge of the finished blade application, can preferably be made in a continuous coating process using EB evaporation, but also other processes may be used.

Exemplary forms of the coated steel products described herein can be used in applications where a hard dense wear resistant coating may be suitable, such as: scissors and pruning shears, kitchen and bakery tools, handtools for plastering, trowels, medical instruments and surgical knives, razor blades, cutters, flapper valves, die cutting tools, saws and various knives in general, such as utility knives, e.g., slicers, carving knives, bread knives, butcher's knives, mixer blades, hunting and fishing knives, pocket knives and industrial knives for cutting synthetic fibre, paper, plastic film, fabrics and carpets.

Thus, a strip material according to the exemplary embodiments is also suitable to use in shaving equipment such as razor blades and cutters, and medical instruments such as thin surgical knives. The thickness of the substrate material is rather thin in these types of applications, normally between 0.015 to 0.75 mm and usually 0.015 to 0.6 mm and preferably 0.03 to 0.45 mm. The thickness of the coating can accordingly preferably be as thin as possible, normally in total between 0.1 to 5 μm and usually 0.1 to 3 μm and preferably 0.1 to 2 μm or even more preferably 0.1 to 1 μm. In this case, it is thus preferred to have a small ratio between the thickness of the coating and the thickness of the strip material. The ratio is normally between 0.01% to 7% and preferably between 0.01 to 5%.

One further use of these exemplary embodiments is that the coating may be applied before the hardening and tempering treatment of the substrate material. The hard and dense coating should, in this case, be able to withstand a hardening temperature of minimum 400° C. and preferably more than 800° C., and more preferably above 950° C., for holding times at hardening temperatures normally used in a hardening of said substrate material so as to obtain a tensile strength, i.e., a minimum tensile strength of 1200 MPa. After such a hardening procedure, the properties of the thin layer should be maintained as designated herein, i.e., the coating should have a good adhesion and be hard, dense and abrasion resistant and have a hardness of at least 600 HV, usually 700 HV, preferably 800 HV and more preferably 900 HV.

For further illustration, typical dimensions in the case of a strip material for razor blades would be a substrate material with a thickness below 0.15 mm, normally less than 0.10 mm, and a strip width of about 400 mm and a coating thickness of below 5 μm, usually 2 μm, normally less than around 1 μm, or even thinner.

A strip material according to exemplary embodiments is suitable to use also in various utility and industrial knife applications and also saw applications. The thickness of the substrate material is rather thick in this type of application, normally between 0.1 to 5 mm and usually between 0.2 to 3 mm. The thickness of the coating is however kept as thin as possible, normally in total between 0.1 to 10 μm and usually 0.1 to 5 μm and preferably 0.1 to 3 μm or even more preferably 0.1 to 2 μm. In this case, it is thus preferred to have a small ratio between the thickness of the coating and the thickness of the strip material. The ratio is normally between 0.001% to 7% and preferably between 0.01 to 5%.

Another further use of these exemplary embodiments is that the coating may be applied before the hardening and tempering treatment of the substrate material. The hard and dense coating should in this case be able to withstand a hardening temperature of minimum 400° C. and preferably more than 800° C., and more preferably above 950° C., for holding times at hardening temperature normally used in a hardening of said substrate material so as to obtain a tensile strength, i.e., a minimum of 1200 MPa. After such a hardening procedure, the properties of the thin coating should be maintained as described herein, i.e. the coating should have a good adhesion and be hard, dense and abrasion resistant and have a hardness of minimum 600 HV, usually 700 HV, preferably 800 HV and more preferably 900 HV.

Examples 1 and 2 above both show exemplary embodiments that in an analogous way apply for razor blades and/or thin surgical knives and/or utility and industrial knives and/or saw applications. Thus, these examples illustrate coating methods and substrate materials suitable for these applications. The only difference is the sequence order for hardening and tempering, which can be altered with the coating, as also described above.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A coated steel strip product, comprising:
   a steel strip substrate; and
   a dense and hard abrasion resistant coating on one side or both sides of said strip substrate,
   wherein the coating is directly applied on the strip substrate, a thickness of the coating is in total maximally 25 µm, a ratio between the thickness of the coating and a thickness of the strip substrate is 0.001 to 7%, a hardness of the coating is at least 600 HV and a tensile strength of the steel strip substrate is at least 1200 MPa, and
   wherein the coating is a metallic coating consisting essentially of Cr.

2. The product according to claim 1, wherein the thickness of the strip substrate is between 0.015 mm and 5.0 mm.

3. The product according to claim 1, wherein the strip substrate is made of hardenable carbon steel, hardenable stainless chromium steel, or precipitation hardenable strip steel.

4. The product according to claim 1, wherein the ratio between the thickness of the coating and the thickness of the strip substrate is 0.01 to 7%.

5. The product according to claim 4, wherein the ratio is 0.01 to 5%.

6. The product according to claim 1, wherein the coating has a multi-layer structure of up to 10 layers.

7. The product according to claim 6, wherein each individual layer of the multi-layer structure has a thickness of between 0.1 to 15 µm.

8. The product according to claim 6, comprising at least one layer of nickel having a thickness up to 2 µm, the at least one layer not adjacent the strip substrate.

9. A shaving product, including the coated steel strip product as in any one of claims 1, 6 and 8.

10. The shaving product of claim 9, wherein the shaving product is a razor blade.

11. A knife including the coated steel strip product as in any one of claims 1, 6 and 8.

12. The knife of claim 11, wherein the knife is a utility knife, an industrial knife, or a surgical knife.

13. A saw including the coated steel strip product as in any one of claims 1, 6 and 8.

14. The saw according to claim 13, wherein the saw is a hand saw or an industrial saw.

15. A method of manufacturing a coated steel strip product, the coated steel strip product having a steel strip substrate and a dense and hard abrasion resistant coating on one side or both sides of said strip substrate, wherein the coating is directly applied on the strip substrate, a thickness of the coating is in total maximally 25 µm, a ratio between the thickness of the coating and a thickness of the strip substrate is 0.001 to 7%, a hardness of the coating is at least 600 HV and a tensile strength of the steel strip substrate is at least 1200 MPa, the method comprising:
    operating a strip production line in a continuous roll-to-roll process at a feed rate of at least 2.5 m/min to feed the strip substrate, wherein operating includes moving the strip substrate through atmospherically controlled chambers including an etch chamber and an electron beam deposition chamber;
    removing a thin oxide layer from the strip substrate by ion assisted etching in the etch chamber to form a cleaned strip substrate; and
    depositing the coating directly on the cleaned strip substrate by electron beam evaporation in the electron beam deposition chamber, wherein both the etch chamber and the electron beam deposition chamber are integrated into the continuous roll-to-roll process; and
    comprising forming the coated strip substrate into a final dimension by slitting or edge treatment,
    wherein the coating is a multi-layer coating comprising Cr and the method comprises forming the multi-layer coating by a plurality of depositions by electron beam evaporation.

16. The method according to claim 15, wherein depositing by electron beam evaporation is plasma activated.

17. The method according to claim 15, wherein a variation in the thickness of the coating across the entire width of the strip substrate is maximally ±10% of the thickness of the coating.

* * * * *